United States Patent
Reyes, Jr. et al.

[11] Patent Number: 6,149,368
[45] Date of Patent: Nov. 21, 2000

[54] WAFER DISK PAD HAVING ONE OR MORE WAFER LOADING POINTS TO FACILITATE VACUUM WAND WAFER LOADING AND UNLOADING

[75] Inventors: J. Carlos Reyes, Jr.; David S. McStay; Donald L. Friede, all of Austin, Tex.

[73] Assignee: Advanced Micro Devices, Inc., Sunnyvale, Calif.

[21] Appl. No.: 09/097,245

[22] Filed: Jun. 12, 1998

[51] Int. Cl.$^7$ .................................................. B65H 1/00
[52] U.S. Cl. ........................ 414/416; 414/936; 414/937; 414/941; 206/710
[58] Field of Search ................................. 414/416, 941, 414/937, 936; 248/316.7, 316.8; 206/710, 712, 454; 211/41.18; 269/21, 242, 267, 161, 153

[56] References Cited

U.S. PATENT DOCUMENTS

| | | | |
|---|---|---|---|
| D. 411,070 | 6/1999 | Jongwatana | 211/41.18 |
| 4,655,584 | 4/1987 | Tanaka et al. | 414/936 |
| 4,744,713 | 5/1988 | Hrovath | 414/222 |
| 4,776,745 | 10/1988 | Foley | 414/936 |
| 4,990,047 | 2/1991 | Wagner et al. | 414/937 |
| 5,046,909 | 9/1991 | Murdoch | 414/936 |
| 5,188,501 | 2/1993 | Tomita et al. | 294/1.1 |
| 5,794,798 | 8/1998 | Kim | 211/41.18 |
| 5,915,910 | 6/1999 | Howells et al. | 414/941 |
| 5,938,902 | 8/1999 | Nguyen et al. | 414/941 |
| 5,951,770 | 9/1999 | Perlov et al. | 414/941 |

*Primary Examiner*—Douglas Hess
*Attorney, Agent, or Firm*—Kevin L. Daffer; Conley, Rose & Tayon

[57] ABSTRACT

A wafer disk pad is presented having one or more wafer loading points to facilitate wafer loading and unloading using a vacuum wand. The wafer loading points comprise grooves in a base plate. Each groove begins at a frontside surface of the base plate, extends under a portion of an upper surface of the base plate reserved for wafer placement, and is dimensioned to receive a tip of a vacuum wand. In one embodiment, the base plate includes a pair of grooves. A first groove is located on a left side of the wafer disk pad, and is conveniently located and oriented for left-handed operators. A second groove is located on a right side of the wafer disk pad, and is conveniently located and oriented for right-handed operators facing the frontside surface. Each groove is preferably sloped to facilitate separation of the semiconductor wafer from the pad. The depth of each groove is greatest at the frontside surface and decreases with increasing lateral distance into the base plate from the frontside surface. A clamp member hingably attached to the base plate includes a resilient member for holding the semiconductor wafer against the base plate when the wafer disk pad is in a closed position. In one embodiment, the clamp member includes a clamp base, a pair of clamp arms, a pair of clamp fingers, and a pair of handles.

6 Claims, 5 Drawing Sheets

WAFER DISK PAD HAVING ONE OR MORE WAFER LOADING POINTS TO FACILITATE VACUUM WAND WAFER LOADING AND UNLOADING

BACKGROUND OF THE INVENTION

1. Field of the Invention

This invention relates to equipments used to manufacture integrated circuits and more particularly to wafer disk pads (i.e., wafer clamps) for holding semiconductor wafers in place during wafer fabrication operations.

2. Description of the Relevant Art

Integrated circuits are typically manufactured using a series of semiconductor wafer fabrication operations. Such operations are used to form multiple integrated ciruits upon and within an exposed surface of a semiconductor wafer. As defined herein, the four basic wafer fabrication operations are layering, patterning, doping, and heat treatments. Many wafer fabrication equipments include wafer disk pads for holding semiconductor wafers in place during wafer fabrication operations. Such equipments include ion implantation devices and various types of deposition devices (e.g., sputter deposition devices, chemical vapor deposition devices, etc.).

Ion implantation is one method of forming doped regions (i.e., regions of n-type or p-type dopant atoms) within a surface of a semiconductor wafer. Ion implantation is a physical process in which dopant atoms are ionized, accelerated to a velocity high enough to penetrate the surface of a semiconductor wafer, focused into a narrow beam, and scanned as a beam across the surface of a semiconductor wafer. Dopant ions impacting the surface of the wafer enter the wafer and come to rest below the surface. Offering a high level of control over the location and number of dopant ions placed within the surface of a semiconductor wafer, ion implantation is widely used in the manufacture of integrated circuits with submicron feature sizes.

FIG. 1 is a cross-sectional view of a portion of an exemplary ion implantation device 10. Such an ion implantation device is the model Nova NV-10 manufactured by the Eaton Corp. (Beverly, Mass.). Ion implantation device 10 includes a beam chamber 12 coupled to a process chamber 14. Beam chamber 12 and process chamber 14 are evacuated during ion implantation. Process chamber 14 includes a process chamber base 16 and a process chamber cover 18. Ion implantation is carried out with process chamber cover 18 in a raised position as shown. A wafer disk 20 is mounted on one side of process chamber cover 18, and rotary wafer disk positioner 22 is coupled to process chamber cover 18 on the opposite side. Process chamber cover 18 is hinged to allow the loading and unloading of semiconductor wafers from wafer disk pads attached to wafer disk 20. Such loading and unloading is performed with process cover 18 in a lowered position 24.

Multiple semiconductor wafers are mounted within wafer disk pads attached to the outer periphery of wafer disk 20. During an ion implantation procedure, a process chamber positioner 26 moves process chamber 14 vertically relative to beam chamber 12, and rotary wafer disk positioner 22 rotates wafer disk 20 in order to selectively position the semiconductor wafers within process chamber 14. Process chamber positioner 26 and rotary wafer disk poisitioner 22 work together in order to affect mechanical scanning of a stationary dopant ion beam 28 over surfaces of the semiconductor wafers. An aperture 30 in process chamber base 16 allows gaseous communication between beam chamber 12 and process chamber 14, and also allows dopant ion beam 28 to enter process chamber 14 from beam chamber 12. A sliding seal 32 is used to keep air at atmospheric pressure from entering evacuated process chamber 14 and beam chamber 12.

FIG. 2 is a front elevation view of wafer disk 20 of ion implantation device 10 as seen from beam chamber 12 during an ion implantation procedure. Wafer disk 20 may include ten wafer disk pads 34 arranged about the periphery of wafer disk 20 and configured to hold ten semiconductor wafers 36 in place during an ion implantation procedure. Wafer disk 20 also includes a Faraday slot 38 used to measure wafer dopant dose level.

FIG. 3 is a perspective view of an exemplary wafer disk pad 34. Wafer disk pad 34 includes a clamp member 36 hingably attached to a base plate 38. Wafer disk pad 34 also includes a resilient member (e.g., a spring) which urges clamp member 36 toward base plate 38. Base plate 38 includes a flat, circular pad 40 for receiving a backside surface of a semiconductor wafer. Clamp member 36 includes a clamp base 42, two clamp arms 44a and 44b, two clamp fingers 46a and 46b, and a single clamp handle 48. Clamp base 42 is hingably attached a back portion of an upper surface of base plate 38. Clamp arms 42a and 42b extend along opposite sides of base plate 38 toward a frontside surface of wafer disk pad 34. Clamp fingers 46a and 46b extend perpendicularly from respective clamp arms 44a and 44b, and are directed toward one another and the center of base plate 38. Handle 48 is attached to the end of clamp arm 44a nearest clamp finger 46a such that handle 48 is on the left side of wafer disk pad 34.

Wafer disk pad 34 is shown in an open position in FIG. 3. In the open position, clamp arms 42a–b are raised, and a semiconductor wafer may be loaded into or unloaded from wafer disk pad 34. In a closed position, clamp fingers 46a–b contact an outer perimeter of a semiconductor wafer positioned upon pad 40. The resilient member which urges clamp member 36 toward base plate 38 in the closed position allows wafer disk pad 34 to hold the semiconductor wafer in place.

Base plate 38 includes a rectangular opening 50 to facilitate the loading of a semiconductor wafer into and the unloading of a semiconductor wafer from wafer disk pad 34 using a pair of tweezers. Opening 50 is located in the center of the frontside surface of base plate 38.

Tweezers undesirably contact and exert pressure upon both frontside and backside major surfaces of a semiconductor wafer in order to grip the wafer. The tweezer tip which contacts the frontside surface, upon which active devices are formed, may introduce contaminants which deleteriously affect device operation. In addition, the pressure which must be exerted by the tweezer tips in order to grip the wafer may cause physical damage to the wafer.

For the above reasons vacuum wands have largely replaced tweezers as preferred semiconductor wafer transport tools. A typical vacuum wand has a tip, stem, and handle. The stem is a vacuum tube which connects the tip to the handle. The tip has a flat upper surface having an orifice located substantially in the center. During use, the tip is brought into contact with the underside surface of a semiconductor wafer. Pressing a button on the handle causes air to be drawn into the orifice, creating a vacuum between the tip and the wafer which couples the wafer to the tip. Releasing the button breaks the vacuum and allows the wafer to separate from the tip. As the vacuum wand does not contact the frontside surface of the wafer, the vacuum wand cannot introduce contaminants onto the frontside surface. In addition, the vacuum force which holds the wafer to the tip is not great enough to cause physical damage to the wafer.

Several problems arise when trying to use a vacuum wand with wafer disk pad 34 of FIG. 3. First, the tips of most commercially available vacuum wands are too large to fit into opening 50 designed for tweezers. Second, located in the center of one side of wafer disk pad 34, opening 50 is not convenient for use by either right-handed or left-handed operators facing wafer disk pad 34. A right-handed operator must position his or her body on the left side of opening 50 and angle his or her body in relation to wafer disk pad 40 in order to comfortably insert a wafer into or remove a wafer from wafer disk pad 34. A left-handed operator must position his or her body on the right side of opening 50 and again angle his or her body in relation to wafer disk pad 40 in order to comfortably insert a wafer into or remove a wafer from wafer disk pad 34. Third, single handle 48 is only convenient for right-handed operators. Left-handed operators hold vacuum wands in their left hands and must reach across with their right hands to operate handle 48.

Experience with wafer disk pad 34 of FIG. 3 in a manufacturing environment has shown that due to the above shortcomings operators will often not use opening 50 for vacuum wand wafer loading and unloading. Instead, they will force the tip of the vacuum wand between the wafer and base plate 38 to the right or the left of opening 50. As a result, pad 40 is damaged during wafer loading and unloading, and must be replaced frequently. In addition, loose pieces of pad 40 become particulate contaminants within process chamber 14 during ion implantation operations.

It would thus be beneficial to have a wafer disk pad having one or more wafer loading points at convenient locations to facilitate vacuum wand wafer loading and unloading. Such a wafer disk pad would significantly reduce damage to pad 40 and the resultant particulate contaminant problem within process chamber 14.

SUMMARY OF THE INVENTION

The problems outlined above are in large part solved by a wafer disk pad having one or more wafer loading points to facilitate wafer loading and unloading using a vacuum wand. The wafer loading points comprise grooves in a base plate. Each groove begins at a frontside surface of the base plate, extends under a portion of an upper surface of the base plate reserved for wafer placement, and is dimensioned to receive a tip of a vacuum wand.

In one embodiment, the base plate includes a pair of grooves which function as wafer loading points. A first groove is located on the left side of a centerline perpendicular to the frontside surface and dividing the wafer disk pad into a right half and a left half. A second groove is located on the right side of the centerline. Each groove extends toward a center of the portion of the upper surface of the base plate reserved for wafer placement. The first groove is conveniently located and oriented for left-handed operators facing the frontside surface, and the second groove is conveniently located and oriented for right-handed operators facing the frontside surface.

In one embodiment, the portion of an upper surface of the base plate reserved for wafer placement is covered by a flat, circular pad made of a heat-resistant material (e.g., Teflon™ polymer resin). The pad improves heat transfer between a backside surface of a semiconductor wafer and the base plate. During processing, the backside surface of the semiconductor wafer may adhere to the pad. For example, during an ion implantation procedure, heat is generated within the semiconductor wafer which causes the semiconductor wafer to stick to the pad. Each groove is preferably sloped to facilitate separation of the semiconductor wafer from the pad. The depth of each groove is greatest at the frontside surface and decreases with increasing lateral distance into the base plate from the frontside surface.

When the semiconductor wafer is to be removed from the wafer disk pad, an operator inserts the tip of a vacuum wand into one of the grooves. The slope of the groove causes the tip of the vacuum wand to move upward with increasing lateral distance into the base plate. An upper surface of the vacuum wand eventually contacts the underside surface of the semiconductor wafer and exerts an upward force upon the backside surface, similar to a wedge driven between two members requiring separation. This upward force causes the semiconductor wafer to separate from the base plate.

The wafer disk pad also includes a clamp member hingably attached to the upper surface of the base plate. The wafer disk pad includes an open position and a closed position. The clamp member includes a resilient member for holding the semiconductor wafer against the base plate when the wafer disk pad is in the closed position. The resilient member may be, for example, a spring.

In one embodiment, the clamp member includes a clamp base, a pair of clamp arms, a pair of clamp fingers, and a pair of handles. The clamp base is hingably attached to the upper surface of the base plate along a back portion of the upper surface. Each clamp arm includes a first and second end. The first end of each clamp arm is attached to the clamp base and extends from the clamp base along a perimeter of the upper surface of the base plate toward a front portion of the upper surface. Each clamp finger is attached to a respective clamp arm near the second end of the clamp arm, and extends perpendicularly from an axis of the respective clamp arm. The clamp fingers are directed toward one another and the center of the upper surface of the base plate.

Each handle extends from the second end of a respective clamp arm and along an axis of the clamp arm. A first handle on the left side of the wafer disk pad is conveniently located for left-hand operation by right-handed operators holding a vacuum wand in their right hand. A second handle on the right side of the wafer disk pad is conveniently located for right-hand operation by left-handed operators holding a vacuum wand in their left hand.

BRIEF DESCRIPTION OF THE DRAWINGS

Other objects and advantages of the invention will become apparent upon reading the following detailed description and upon reference to the accompanying drawings in which.

Figure 1:
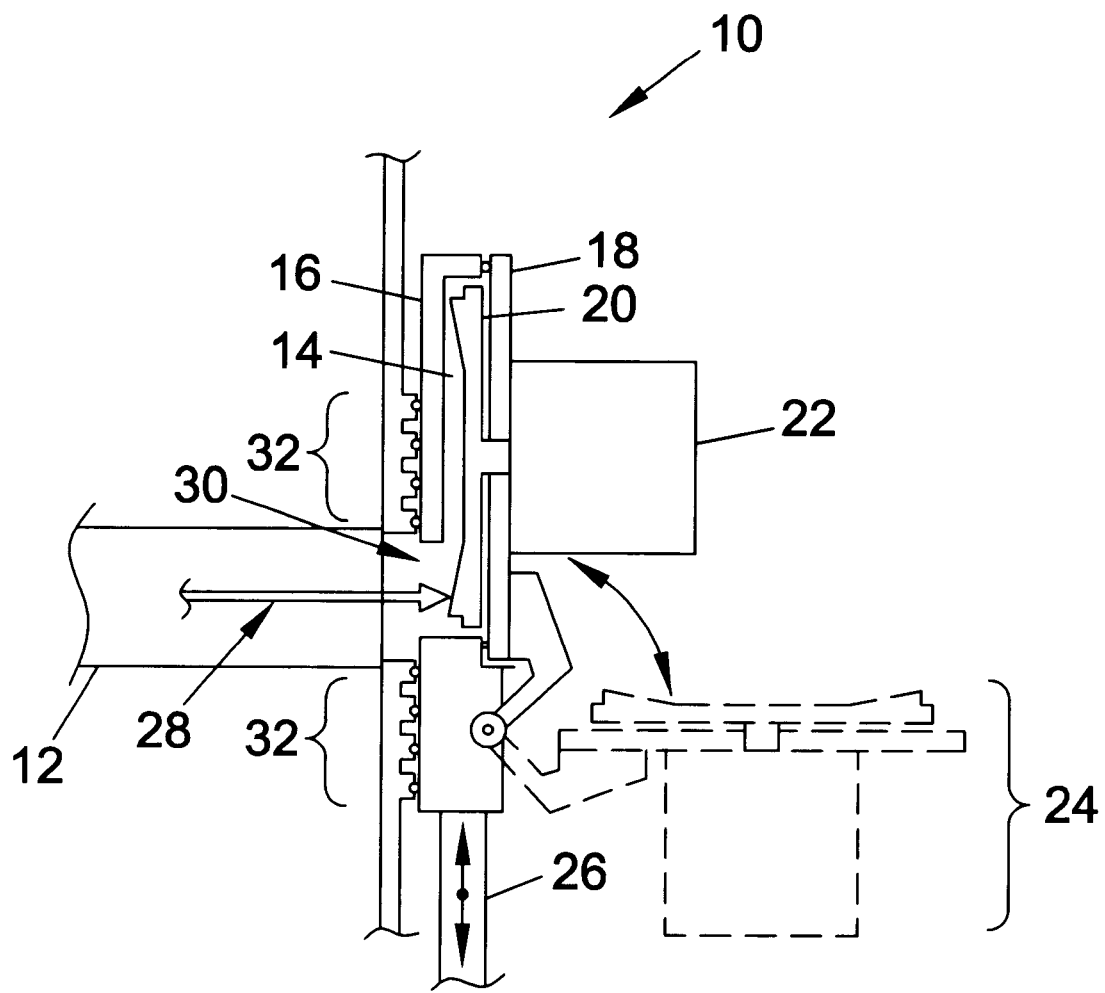
FIG. 1 is a cross-sectional view of a portion of an exemplary ion implantation device including a wafer disk having multiple wafer disk pads used to hold semiconductor wafers in place during processing.
Figure 2:
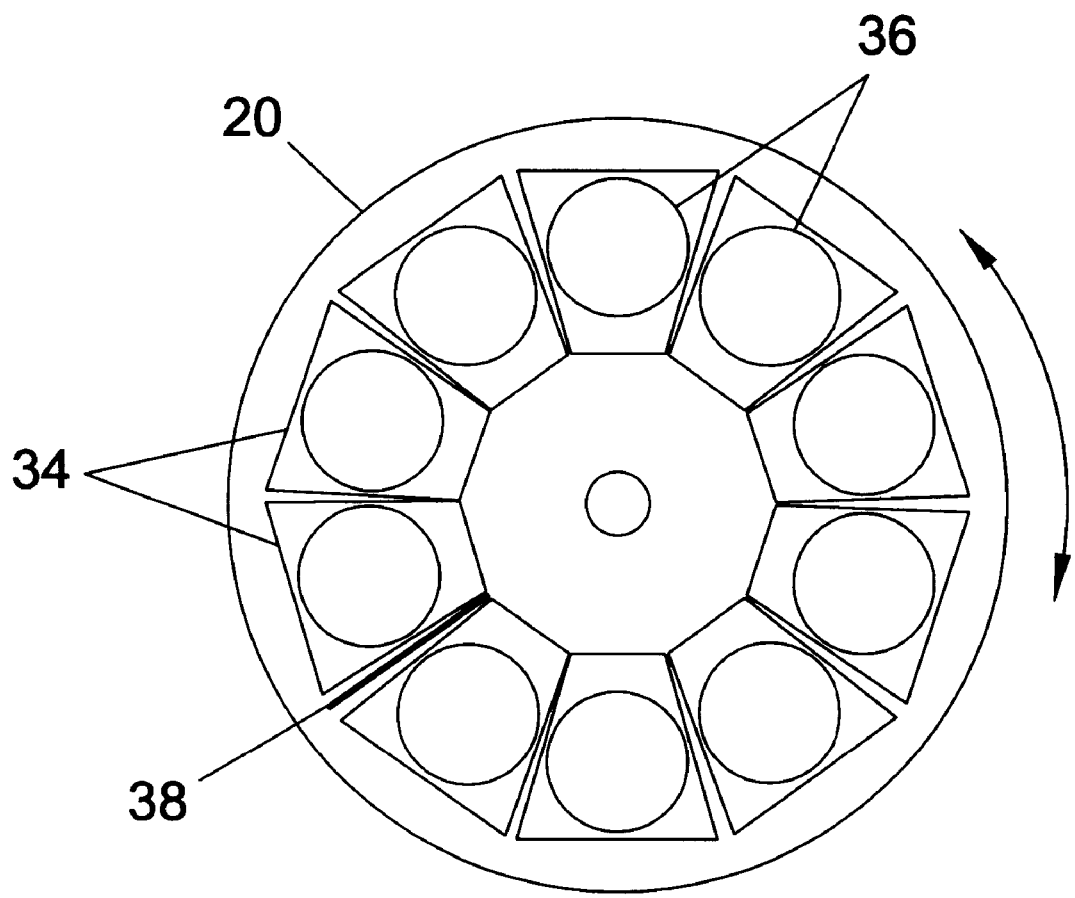
FIG. 2 is a front elevation view of the wafer disk of FIG. 1 illustrating the multiple wafer disk pads arranged about the periphery of the wafer disk.
Figure 3:
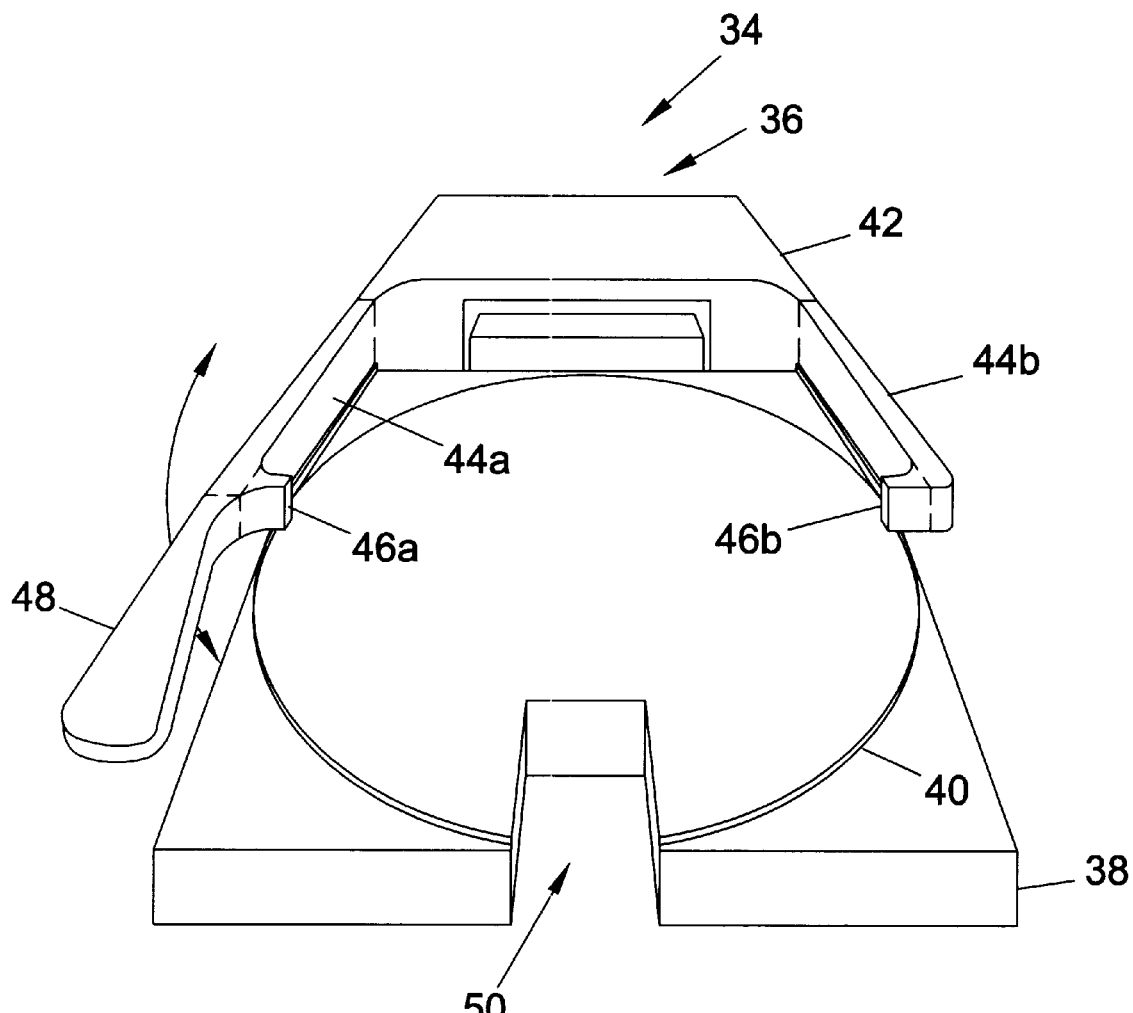
FIG. 3 is a perspective view of an exemplary wafer disk pad of FIG. 2, wherein the wafer disk pad includes a base plate having a single rectangular opening in the center of a frontside surface for the loading and unloading of a semiconductor wafer from the wafer disk pad using a pair of tweezers, and wherein the wafer disk pad also includes a clamp member having a single handle located on a left side.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
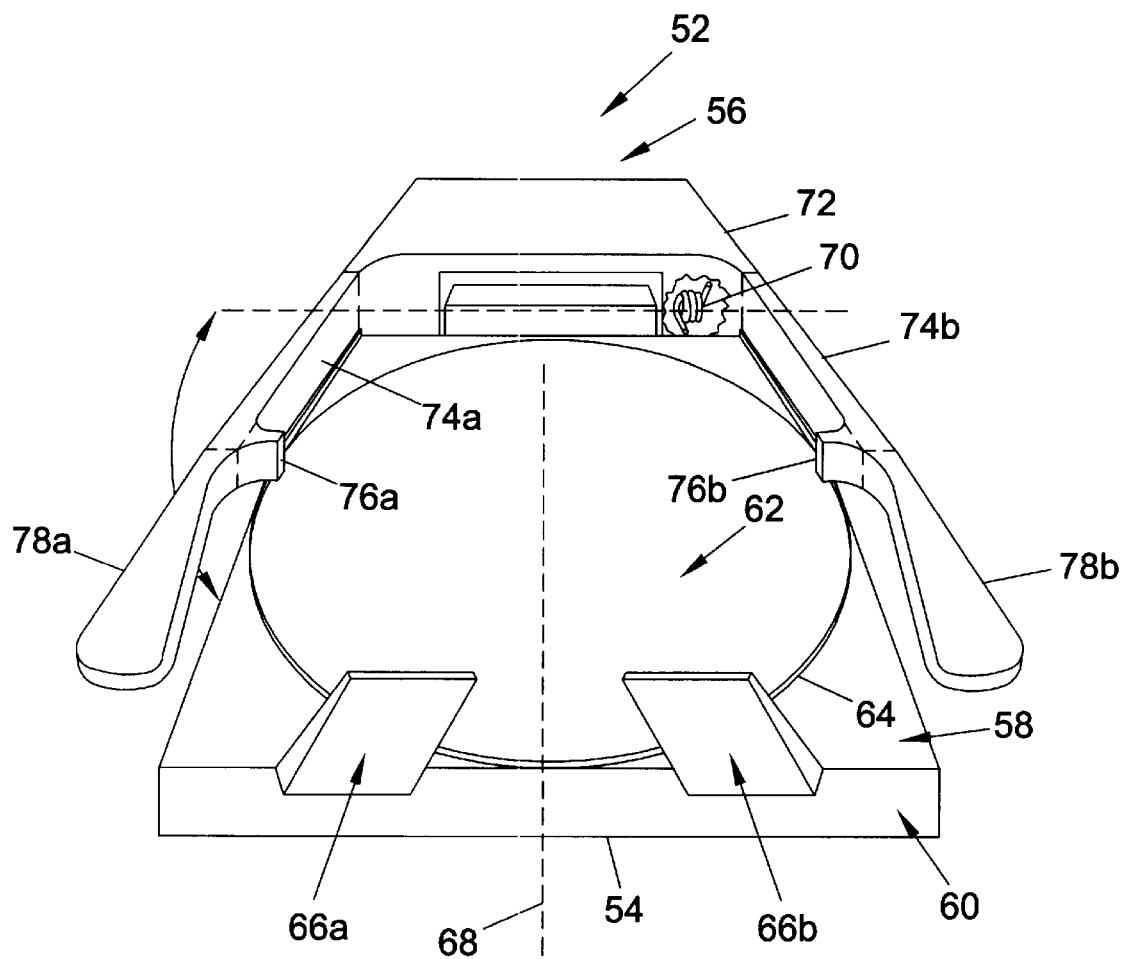
FIG. 4 is a perspective view of one embodiment of a wafer disk pad in accordance with the present invention, wherein the wafer disk pad includes a base plate having a pair of grooves in an upper surface which function as wafer loading points, and wherein each groove begins at a frontside surface of the base plate, extends under a portion of an upper surface of the base plate reserved for wafer placement, and is dimensioned to receive a tip of a vacuum wand, and wherein a first groove is conveniently located on a left side of the water disk pad for left-handed operators, and wherein a second groove is conveniently located on a right side of the wafer disk pad for right-handed operators, and wherein each groove is sloped to facilitate separation of the semiconductor wafer from the pad, and wherein a clamp member of the wafer disk pad includes a pair of handles on either side.

FIG. 4 is a perspective view of one embodiment of a wafer disk pad 52 in accordance with the present invention. Wafer disk pad 52 may be used within various types of wafer processing devices to hold a semiconductor wafer in place during a wafer fabrication operation. Such wafer processing devices include, for example, ion implantation devices and various types of deposition devices (e.g., sputter deposition devices, chemical vapor deposition devices, etc.).

Wafer disk pad 52 includes a base plate 54 and a clamp member 56. Base plate 54 has a substantially flat upper surface 58 and a frontside surface 60. A portion 62 of upper surface 58 is reserved for placement of a backside surface of a semiconductor wafer. In the embodiment of FIG. 4, portion 62 is covered by a circular pad 64. Pad 64 is preferably made of a rigid, heat-resistant material (e.g., a room temperature vulcanizing material) which improves heat transfer between the semiconductor wafer and base plate 54. A center portion of pad 64 may be slightly elevationally raised to further improve heat transfer between the semiconductor wafer and base plate 54.

Base plate 54 includes a pair of grooves 66a and 66b which function as wafer loading points. Each groove 66 begins at frontside surface 60 and extends under portion 62 of upper surface 58 reserved for wafer placement. Each groove 66 is dimensioned to receive a tip of a vacuum wand. Groove 66a is on the left side of a centerline 68 perpendicular to frontside surface 60 and dividing wafer disk pad 52 into a right half and a left half. Groove 66b is on the right side of centerline 68. Each groove 66 extends toward the center of portion 62 of upper surface 60 reserved for wafer placement. Groove 66a is conveniently located and oriented for left-handed operators facing frontside surface 60, and groove 66b is conveniently located and oriented for right-handed operators facing frontside surface 60.

In addition, the depth of each groove 66 is greatest at frontside surface 60 and decreases with increasing lateral (i.e., radial) distance into base plate 54 from frontside surface 60. As will be described in more detail below, the slope of grooves 66a and 66b facilitates wafer removal from wafer disk pad 52. For example, during an ion implantation procedure, heat is generated within a semiconductor wafer positioned within wafer disk pad 52. This heat frequently causes the semiconductor wafer to stick to pad 64. When the semiconductor wafer is to be removed from wafer disk pad 52, an operator inserts the tip of a vacuum wand into groove 66a or 66b. The slope of the groove 66 causes the tip of the vacuum wand to move upward with increasing lateral distance into base plate 54. An upper surface of the vacuum wand eventually contacts the underside surface of the semiconductor wafer and exerts an upward force upon the backside surface. This upward force causes the semiconductor wafer to separate from the base plate.

Clamp member 56 is hingably attached to upper surface 58 of base plate 54. Wafer disk pad 52 includes an open position and a closed position. Wafer disk pad 52 is shown in the open position in FIG. 4. Clamp member 56 includes a resilient member for holding the semiconductor wafer against base plate 54 when wafer disk pad 52 is in the closed position. The resilient member may be, for example, a spring 70 as shown in FIG. 4.

Clamp member 56 includes a clamp base 72, a pair of clamp arms 74a and 74b, a pair of clamp fingers 76a and 76b, and a pair of handles 78a and 78b. Clamp base 72 is hingably attached to upper surface 58 of base plate 54 along a back portion of upper surface 58. Each clamp arm 74 includes a first and second end. The first end of each clamp arm 74 is attached to clamp base 72 and extends from clamp base 72 along a perimeter of upper surface 58 of base plate 54 toward a front portion of upper surface 58. Each clamp finger 76 is attached to a respective clamp arm 74 near the second end of the clamp arm 74. Each clamp finger 76 extends perpendicularly from an axis of the respective clamp arm 74. The clamp fingers 76 are directed toward one another and the center of upper surface 58 of base plate 54.

Each handle 78 extends from the second end of a respective clamp arm 74 and along an axis of the clamp arm 74. Handle 78a is conveniently located for left-hand operation by right-handed operators holding a vacuum wand in their right hands, and handle 78b is conveniently located for right-hand operation by left-handed operators holding a vacuum wand in their left hands.

The open position of wafer disk pad 52 is achieved by raising handle 78a or 78b, and the closed position is achieved by lowering handle 78a or 78b. When wafer disk pad 52 is in the closed position, the resilient member (e.g., spring 70) biases clamp base 72 and attached clamp arms 74a–b and clamp fingers 76a–b toward base plate 54. Clamp fingers 76a–b contact the outer periphery of a semiconductor wafer positioned upon pad 64. As a result, the semiconductor wafer is held against base plate 54 when wafer disk pad 52 is in the closed position.

Figure 5A:
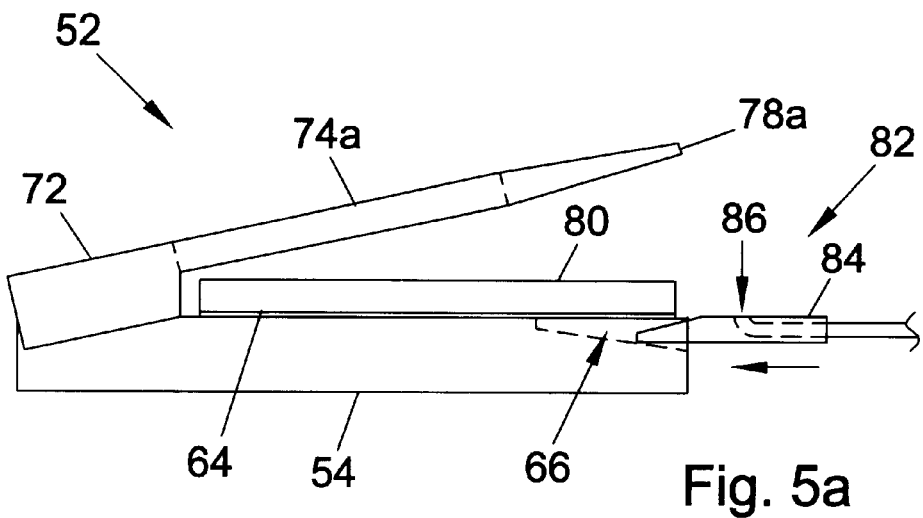
FIG. 5a is a side elevation view of the wafer disk pad of FIG. 4 in an open position and during a semiconductor wafer unloading operation, wherein the semiconductor wafer is positioned within the wafer disk pad, and wherein an operator inserts a tip of a vacuum wand into one of the grooves in the base plate.
Figure 5B:
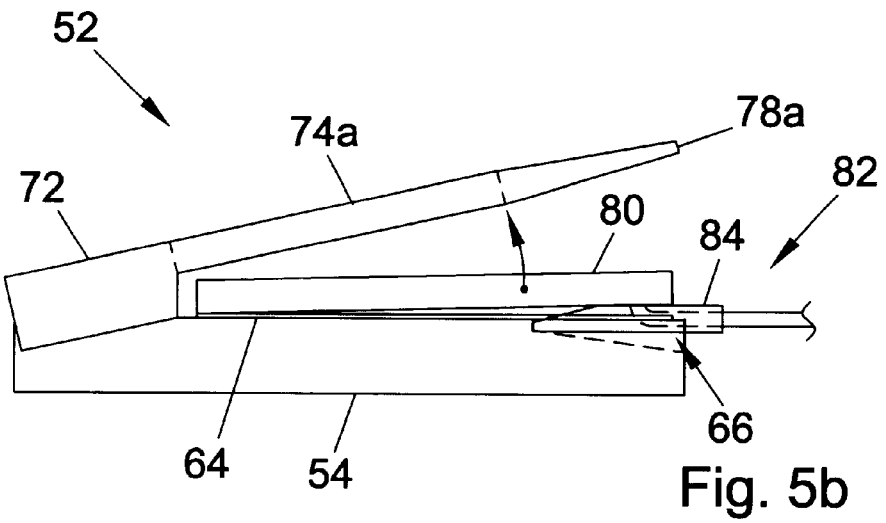
FIG. 5b is a side elevation view of the wafer disk pad of FIG. 4 in an open position and during a wafer unloading operation, wherein the slope of the groove causes an upper surface of the tip of the vacuum wand to contact an underside surface of the semiconductor wafer and exert an upward force upon the backside surface, separating the semiconductor wafer from the base plate.
Figure 5C:
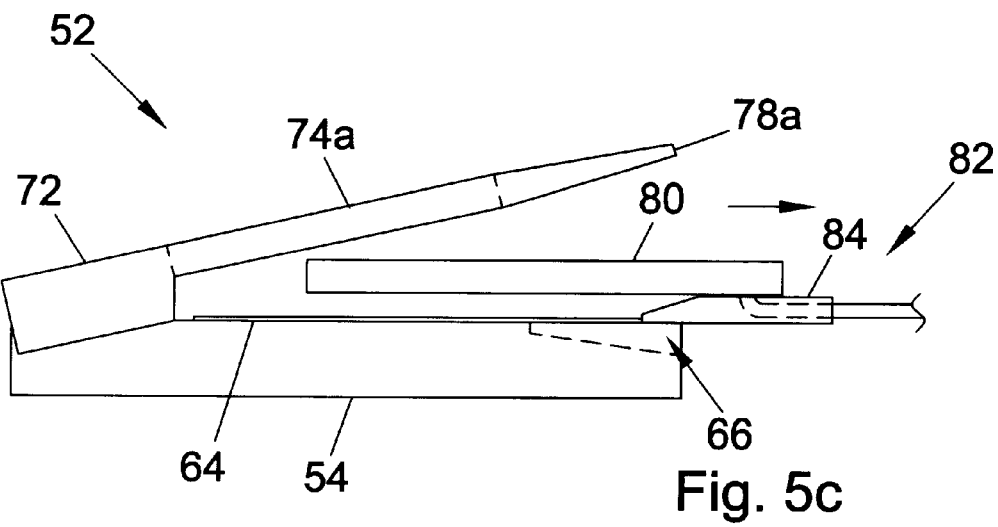
FIG. 5c is a side elevation view of the wafer disk pad of FIG. 4 in an open position and during a wafer unloading operation, wherein the operator retracts the vacuum wand with the semiconductor wafer coupled to the tip of the wand by a vacuum, thus extracting the semiconductor wafer from the wafer disk pad.

FIGS. 5a–c will now be used to illustrate removal of a semiconductor wafer 80 from wafer disk pad 52 using a vacuum wand 82. In the embodiment shown, semiconductor wafer 80 rests upon pad 64 attached to wafer disk pad 52. First, wafer disk pad 52 is placed in the open position as shown. In FIG. 5a, an operator inserts a tip 84 of vacuum wand 82 into groove 66 (i.e., groove 66a or groove 66b) of base plate 54. Tip 84 has an orifice 86 in an upper surface. Air drawn into orifice 86 creates a vacuum between the upper surface of tip 84 and any surface in close proximity thereto.

As tip 84 of vacuum wand 82 is inserted into groove 66, tip 84 contacts the sloped surface of groove 66. As described above, the sloped surface of groove 66 causes tip 84 to move upward with increasing lateral distance into base plate 54. The upper surface of tip 84 eventually contacts an underside surface of semiconductor wafer 80 and exerts an upward force upon the backside surface.

In FIG. 5b, the upward force exerted upon the backside surface of semiconductor wafer 80 by the upper surface of tip 84 causes semiconductor wafer 80 to separate from pad 64 and base plate 54. The sloped surface of groove 66 thus helps overcome any adhesion between the backside surface of semiconductor wafer 80 and pad 64. Such adhesion may result due to heating of semiconductor wafer 80 during, for example, an ion implantation procedure. A vacuum created between the upper surface of tip 84 and the underside surface of semiconductor wafer 80 couples semiconductor wafer 80 and tip 84 of vacuum wand 82. In FIG. 5c, the operator retracts vacuum wand 82 with semiconductor wafer 80 coupled to tip 84, thus extracting semiconductor wafer 80 from wafer disk pad 52.

It will be appreciated by those skilled in the art having the benefit of this disclosure that this invention is believed to be a wafer disk pad having one or more wafer loading points to facilitate wafer loading and unloading using a vacuum wand. The wafer loading points comprise grooves in a base plate. Each groove begins at a frontside surface of the base plate, extends under a portion of an upper surface of the base plate reserved for wafer placement, and is dimensioned to receive a tip of a vacuum wand. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A wafer disk pad for holding a semiconductor wafer in place during a wafer fabrication operation, comprising:
    a base plate having a substantially flat upper surface, wherein a portion of the upper surface is reserved for placement of a backside surface of a semiconductor wafer, and wherein the base plate comprises a pair of grooves, and wherein each groove begins at a frontside surface of the base plate and extends under the portion of the upper surface reserved for wafer placement, and wherein each groove is dimensioned to receive a tip of a vacuum wand;
    a clamp base hingably attached to the upper surface the base plate along a back portion of the upper surface;
    a pair of clamp arms, wherein each clamp arm includes a first and second end, and wherein a first end of each clamp arm is attached to the clamp base, and wherein each clamp arm extends from the clamp base along a perimeter of the upper surface of the clamp base toward a front portion of the upper surface;
    a pair of clamp fingers, wherein each clamp finger is attached to a respective clamp arm near the second end of each clamp arm, and wherein each clamp finger extends perpendicularly from an axis of the respective clamp arm, and wherein the clamp fingers are directed toward one another and the center of the upper surface of the base plate;
    a pair of handles, wherein each handle extends from the second end of a respective clamp arm and along an axis of the clamp arm; and
    means for biasing the clamp base and the attached clamp arms and clamp fingers toward the base plate when the wafer disk pad is in a closed position.

2. The wafer disk pad as recited in claim 1, wherein each groove is on either side of a centerline perpendicular to the frontside surface and dividing the wafer disk pad into right and left halves.

3. The wafer disk pad as recited in claim 1, wherein each groove extends toward the center of the portion of the upper surface reserved for wafer placement.

4. The wafer disk pad as recited in claim 1, wherein the depth of each groove is greatest at the frontside surface and decreases with increasing lateral distance into the base plate from the frontside surface.

5. The wafer disk pad as recited in claim 1, wherein the means for biasing the clamp base and the attached clamp arms and clamp fingers toward the base plate when the wafer disk pad is in a closed position comprises a spring.

6. The wafer disk pad as recited in claim 1, further comprising a pad substantially covering the portion of the upper surface of the base plate reserved for wafer placement.

\* \* \* \* \*